(12) United States Patent
Whaley et al.

(10) Patent No.: US 8,129,910 B2
(45) Date of Patent: Mar. 6, 2012

(54) MAGNETICALLY INSULATED COLD-CATHODE ELECTRON GUN

(75) Inventors: David Riley Whaley, San Carlos, CA (US); Ramon Duggal, San Bruno, CA (US); Carter Michael Armstrong, Danville, CA (US)

(73) Assignee: L-3 Communications Corporation, San Carlos, CA (US)

( * ) Notice: Subject to any disclaimer, the term of this patent is extended or adjusted under 35 U.S.C. 154(b) by 437 days.

(21) Appl. No.: 12/490,251

(22) Filed: Jun. 23, 2009

(65) Prior Publication Data
US 2010/0320912 A1    Dec. 23, 2010

(51) Int. Cl.
*H01J 1/52* (2006.01)
*H01J 5/02* (2006.01)
(52) U.S. Cl. ............ 315/85; 315/111.21; 315/111.41; 315/111.81
(58) Field of Classification Search ............... None
See application file for complete search history.

(56) References Cited

U.S. PATENT DOCUMENTS

| | | | |
|---|---|---|---|
| 3,313,973 A | 4/1967 | Reaney | |
| 4,639,597 A * | 1/1987 | Shiokawa | 250/305 |
| 5,130,607 A | 7/1992 | Lama | |
| 5,399,860 A * | 3/1995 | Miyoshi et al. | 250/310 |
| 5,929,557 A | 7/1999 | Makishima et al. | |
| 6,008,577 A | 12/1999 | Rasmussen et al. | |
| 6,037,717 A | 3/2000 | Maishev et al. | |
| 6,646,382 B2 | 11/2003 | Tanabe | |
| 6,683,414 B2 | 1/2004 | Whaley | |

FOREIGN PATENT DOCUMENTS

WO    WO 2007/142419 A1    12/2007

* cited by examiner

*Primary Examiner* — Anh Tran
(74) *Attorney, Agent, or Firm* — O'Melveny & Myers LLP

(57) ABSTRACT

A system and method of magnetically insulating the cathode of a cold-cathode electron gun is achieved. A strong magnetic field is applied in the vicinity of the cold cathode to deflect and constrain the flow of electrons emitted from structures within the electron gun. The magnetic field largely prevents re-reflected primary and secondary electrons from reaching the cathode, thereby improving the operation and increasing the life of the cold-cathode electron gun. In addition, the insulating magnetic field improves electron beam focusing and enables a reduction in the magnitude of static electric focusing fields employed in the vicinity of the cold cathode, further reducing the electron gun's susceptibility to destructive arcing.

22 Claims, 9 Drawing Sheets

MAGNETICALLY INSULATED COLD-CATHODE ELECTRON GUN

BACKGROUND OF THE INVENTION

1. Field of the Invention

The present invention relates to the design of cold cathode electron guns, and in particular, to structures and methods of magnetically insulating a cold cathode from damaging arc-inducing electron streams originating downstream of the cathode surface.

2. Description of Related Art

The use of an electron-emitting cathode as a source of electrons for focused-electron-beam devices is well known. Most such devices employ thermionic, or "hot" cathodes, but more recently, cold-cathode electron emitters have begun to emerge as higher performance electron sources that have the potential of producing high-density electron beams unachievable using thermionic cathodes. However, focusing and controlling the acceleration of an electron beam generated by a high-density cold-cathode electron emitter represents a significant technical challenge. The electron current density at the cold cathode emission surface is high due to the low electron-emission velocity and relatively small cathode size. This high current density produces a natural rapid Coulomb expansion of the electron beam as it flows away from the cathode surface. In addition, electron beams emitted from a cold cathode are generally characterized by a higher emittance, i.e., a higher inherent perpendicular velocity, than those emitted from an equivalent thermionic cathode. Both of these effects exacerbate the focusing and acceleration control challenges represented by such electron beams.

Certain techniques have been developed to address the focusing of cold-cathode electron beams, such as one invented by one of the inventors of the present application and described in U.S. Pat. No. 6,683,414. That patent describes a series of shaped electrostatic lenses located in front of a cold-cathode emission surface designed to focus the emitted electron beam and confine it within the magnetic field developed inside a travelling-wave tube. However, a difficulty with such a system and other similar approaches that employ electrostatic lenses is that they may increase the susceptibility of the system to destructive arcing between lens elements and the cathode surface. In particular, high voltages are required in order to focus and control the acceleration of the electron beam, and these voltages produce large electric fields in the beam region that can lead to breakdown and cathode arcing.

In addition, beam electrons may impinge upon the lens elements during operation, creating secondary electrons and high-energy re-reflected primary electrons. These electrons, emitted directly from the lens elements themselves, can flow to any 10 other structures within the electron gun that they have sufficient energy to reach, creating unwanted current flow, element heating, vacuum degradation, and potentially, arc initiation. Re-reflected primary electrons, in particular, may result in catastrophic current flow back to the cathode surface itself. It is, therefore, desirable to provide a structure and method for insulating the cold cathode region from the secondary electrons, re-reflected primary electrons, and arc electron streams that may be initiated within the electron gun structure in order to improve the operation and prolong the operating life of a cold-cathode electron emitter.

SUMMARY OF THE INVENTION

An apparatus and method for insulating the cold cathode of an electron gun includes an electron gun having a cold cathode configured to emit an electron beam. One or more electrostatic focusing lenses are provided along the beam path in front of the cold cathode. High voltage potentials are applied to the focusing lenses to focus and confine the electron beam within the region in the vicinity of the cold cathode and the electrostatic lenses and guide it into an optional transport region that may be downstream of the electron gun. A magnetic apparatus is located around the outside of the electron gun and is configured to apply a magnetic field that extends through the gun region, including the cold cathode, the electrostatic lenses, and the electron beam path through that region. The magnetic field is directed such that it is not substantially parallel to a direction from the cathode surface to a surface of any of the lens elements that may be emission sites for secondary electrons or primary re-reflected electrons. Oriented accordingly, the magnetic field acts to insulate the cathode from electrons emitted by the lens elements because they would have to cross many magnetic field lines to propagate from the lens surface to the cathode.

In one embodiment in accordance with the present invention, the magnetic apparatus comprises one or more permanent magnets surrounding the gun region, which includes the region in the vicinity of the cold cathode and the electrostatic lenses. For example, the magnetic apparatus may comprise a single permanent magnet that is sized to fit over the electron gun to create a magnetic field within the gun region. This single permanent magnet may be annular in shape, although other configurations would also fall within the scope and spirit of the present invention. In another embodiment, the magnetic apparatus may comprise several permanent magnets arranged around the electron gun to create the required magnetic field. In still another embodiment, the magnetic apparatus may comprise an electromagnet including a number of windings around the gun region through which an electric current is applied to generate a magnetic field.

In addition to providing insulation of the cathode from secondary electrons and arcing events, the magnetic field also provides additional electron beam focusing, allowing the voltage potentials applied to the lens elements to be reduced. The lower electric field gradients further reduce the probability of arcing within the gun region.

In another embodiment, a transport region including an electron beam drift tube is located along the electron beam path and downstream from the electrostatic lenses in order to receive the electron beam. A transport-region magnetic apparatus may optionally be located in proximity to the drift tube in order to produce a magnetic field within the drift tube for further controlling and confining the electron beam.

Thus, certain benefits of an apparatus and method for magnetically insulating the cathode of a cold-cathode electron gun from secondary electrons and arcing events is achieved. Further advantages and applications of the invention will become clear to those skilled in the art by examination of the following detailed description of the preferred embodiment. Reference will be made to the attached sheets of drawing that will first be described briefly.

DETAILED DESCRIPTION OF THE PREFERRED EMBODIMENT

In the detailed description that follows, like element numerals are used to indicate like elements appearing in one or more of the figures.

Figure 1:
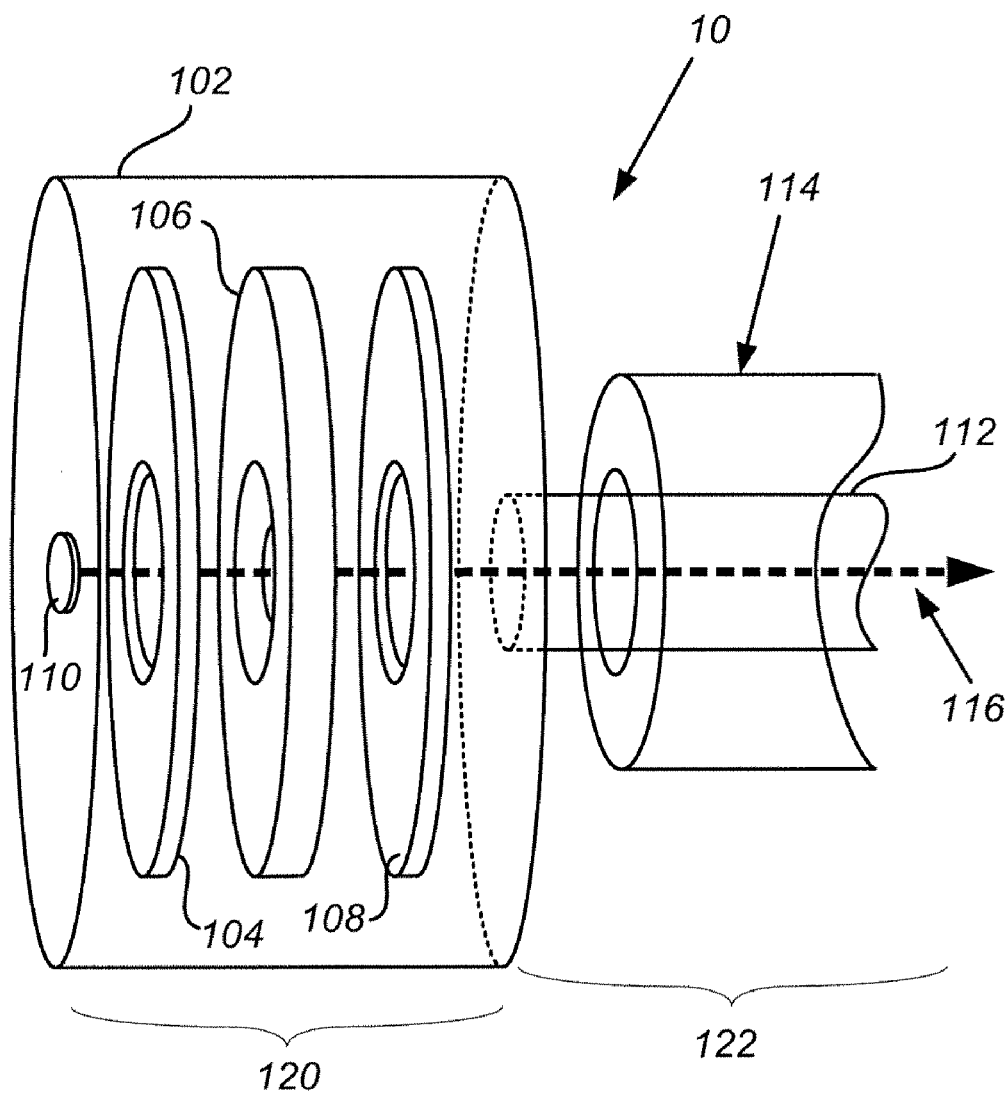
FIG. 1 is a conceptual drawing of a cold-cathode electron gun employing electrostatic focusing lenses as is typical of the prior art.

FIG. 1 illustrates a cold-cathode electron gun 10 employing electrostatic focusing lenses typical of the prior art. Electrons are emitted from the surface of a cold cathode 110 and enter the gun region 120 of the vacuum chamber 102. Shaped electrostatic lenses 104, 106, 108 focus the electron beam 116 and help to maintain a laminar profile as it propagates from the vicinity of the cold cathode and the electrostatic lenses into the transport region 122. The transport region 122 may take on different configurations depending on the application to which the cold-cathode electron gun is applied. Such a transport region 122 often includes a drift tube 112 surrounded by one or several permanent magnets 114, although such a structure is not required for use of the present invention.

Figure 2:
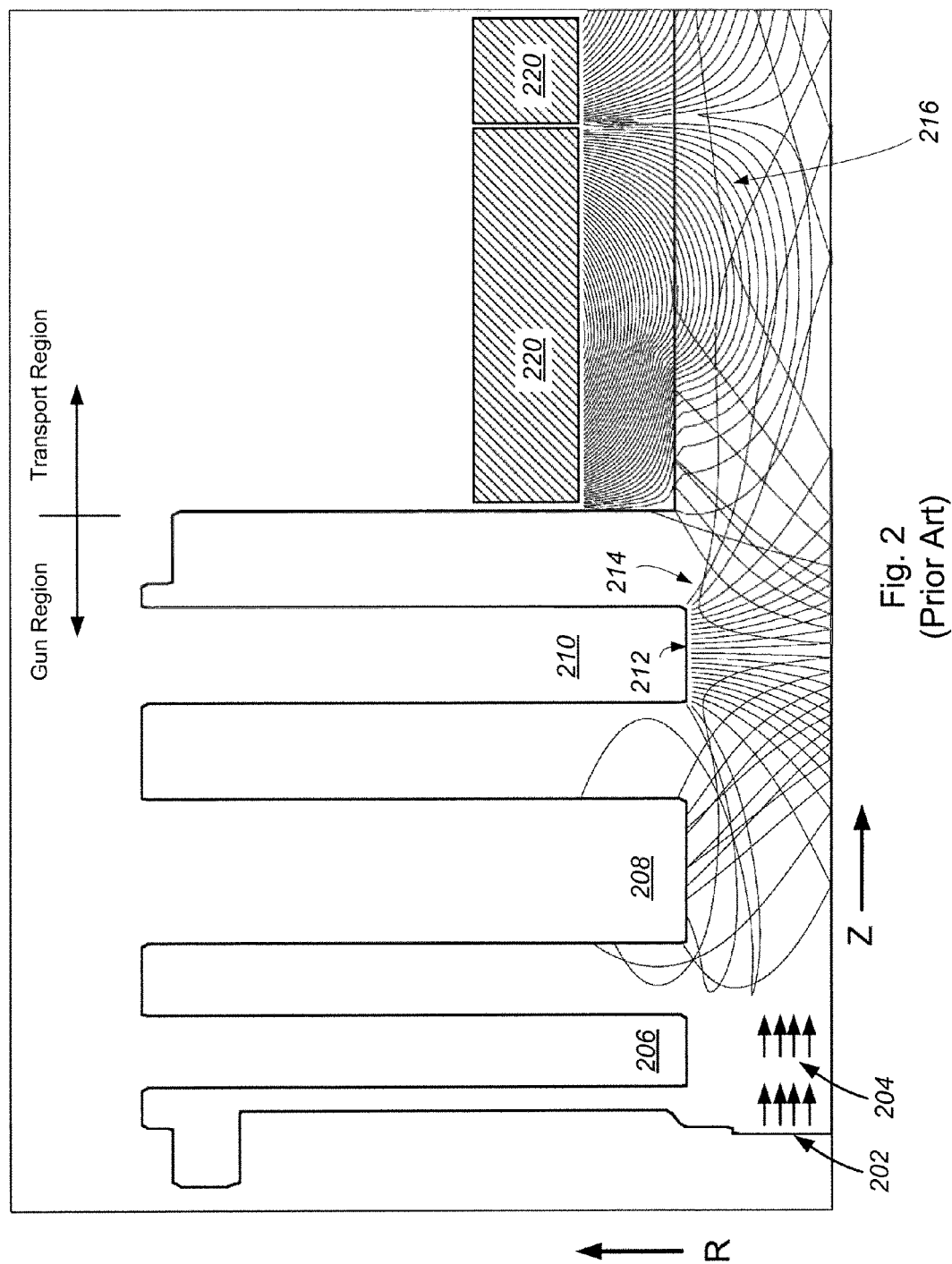
FIG. 2 is a cross section of the cold-cathode electron gun depicted in FIG. 1, illustrating simulated trajectories of secondary electrons emitted from a focusing lens element.

FIG. 2 is an R-Z plot of an electron gun having a cold-cathode electron emitter, with radial distance shown along the vertical axis, and z-length along the horizontal axis. Electrons are emitted from the cold cathode surface 202 and proceed along the beam path 204. Large voltages are applied to electrostatic lens elements 206, 208, 210 in order to control the electron beam as it moves through the gun region. Magnets 220 surrounding a drift tube in the transport region produce a strong magnetic field, indicated by flux lines 216, that confines the electron beam in this region. However, there is little magnetic field in the gun region. Thus, when secondary electrons are emitted from one of the lens elements due to beam interception, they can flow relatively freely to other structures within the electron gun, creating unwanted current flow, element heating, vacuum degradation, and potentially, arc initiation. For example, simulated trajectories of electrons emitted from surface 212 of lens element 210 are depicted at 214. These electrons are produced as the result of an impact by either a primary cathode electron or another secondary electron originating elsewhere within the electron gun, including those created due to ionization of background gas. In reality, such electrons are emitted from all surfaces of lens elements 206, 208, and 210, but emission only from surface 212 is shown for clarity. In this simulation, the electrons 214 are slow secondary electrons with zero initial energy. It can be observed from the figure that the emitted electrons fill the electron gun region, crossing the axis where the main beam propagates. Current also passes to the adjacent lens element 208, which, in an operating device, would generate still more secondary and re-reflected primary electrons. This would cause heating and contamination of the background vacuum.

Figure 3:
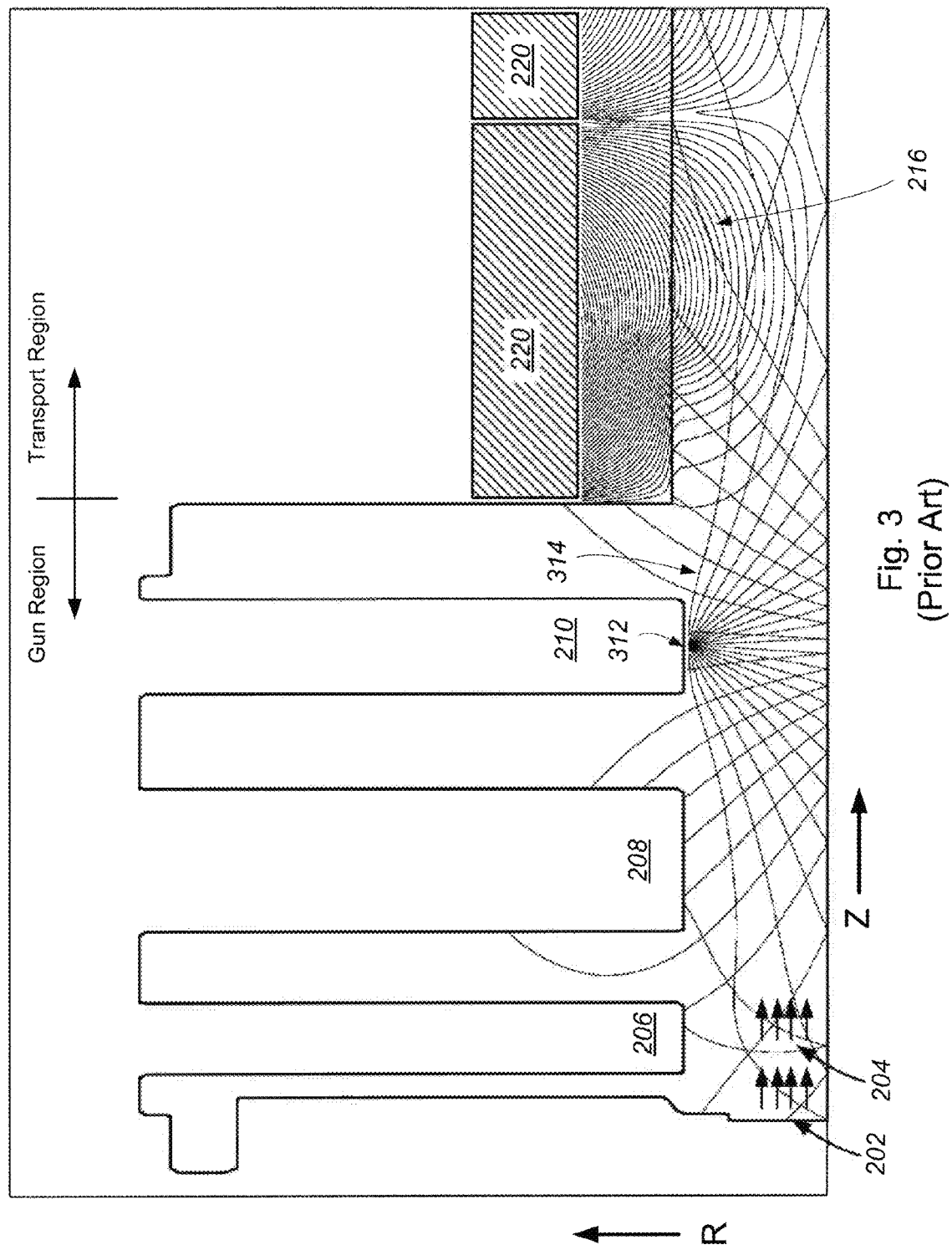
FIG. 3 is a cross section of the cold-cathode electron gun depicted in FIG. 1, illustrating simulated trajectories of primary re-reflected electrons from a focusing lens element.

FIG. 3 is an R-Z plot of a similar electron gun having a cold-cathode electron emitter. In this figure, the effect of re-reflected primary electrons is illustrated. Such electrons are in reality emitted from all surfaces of the lens elements 206, 208, 210, but emission from a single point 312 is shown for clarity. Primary re-reflected electrons are emitted with an energy equal to the electron charge multiplied by the voltage potential difference between the surface of the cathode and that of the lens element. In other words, $E=q_e*(|V_K-V_L|)$, where E is the electron energy, $q_e$ is the electron charge, $V_K$ is the cathode potential, and $V_L$ is the lens potential. Such electrons have a broad range of injection angles, as shown by simulated trajectories 314. Again, it can be seen that such electrons fill the electron gun region, and in this case, even achieve a direct path back to the cathode surface. Such direct cathode interception dramatically increases the probability of life-limiting cathode arcing.

Figure 4:
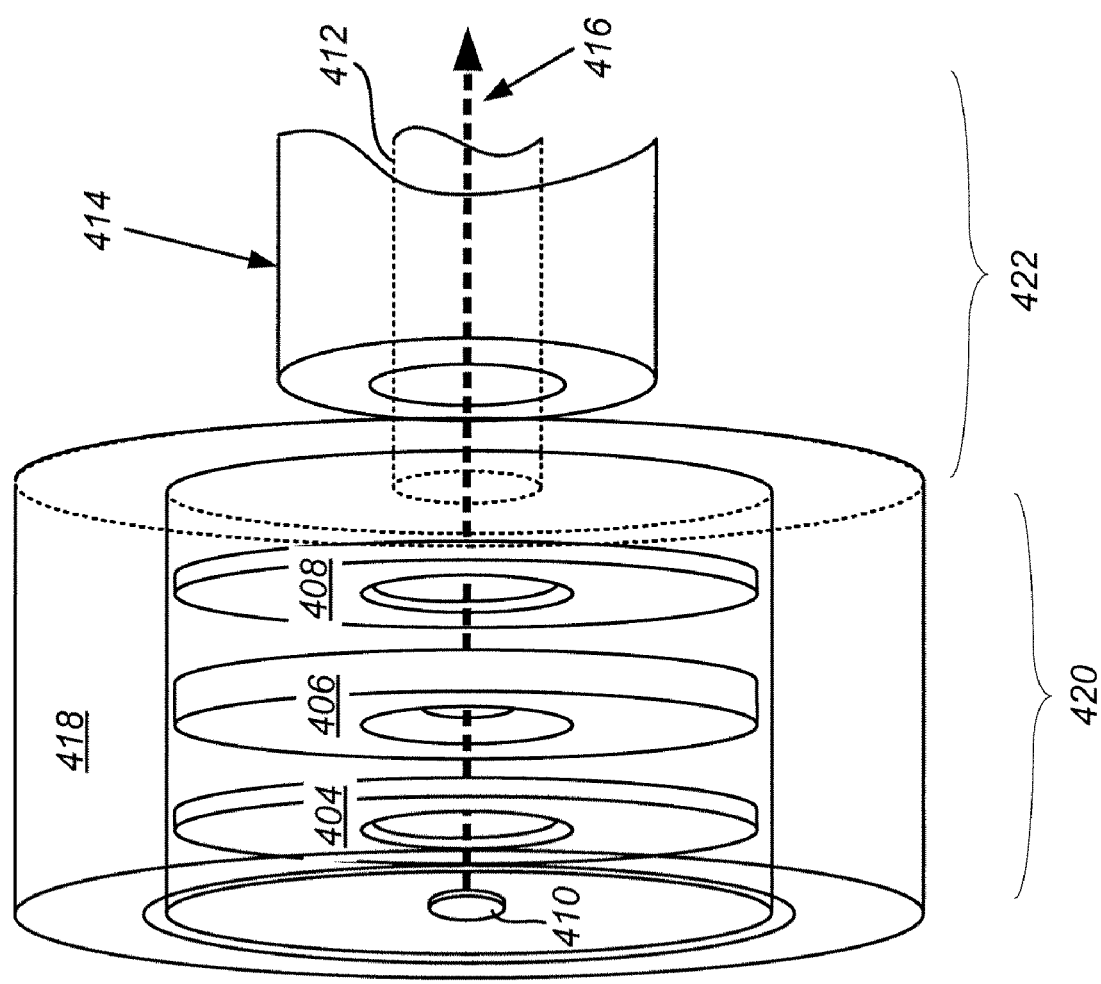
FIG. 4 is a conceptual drawing of a magnetically insulated cold-cathode electron gun in accordance with a preferred embodiment of the present invention.

In the preferred embodiment of the present invention, the cold cathode is magnetically insulated from these damaging electrons by imposing a magnetic field within the gun region to prevent the secondary and re-reflected primary electrons from reaching the cathode. FIG. 4 is a conceptual drawing of a cold-cathode electron gun including a protective magnetic field imposed by a permanent magnet 418 in accordance with the preferred embodiment of the present invention. Electron beam 416 is emitted from cold cathode 410. Electrostatic lenses 404, 406, and 408 are used to focus and confine the electron beam within the gun region 420 and pass it to the transport region 422. In FIG. 4, a transport region 422 is depicted surrounded by one or more permanent magnets 414, although such a structure is not required for use of this invention. Rather, this is merely indicative of one application in which a cold cathode gun in accordance with the present invention may be used. In this embodiment, a strong permanent magnet 418 is situated outside the region including the cathode and lens elements in order to apply a magnetic field within the gun region 420 to insulate the cathode 410 from secondary and primary re-reflected electrons. It should be appreciated that the permanent magnet 418 may be a single magnet having an annular geometry, as shown, or may be comprised of a plurality of magnetic pieces configured and arranged around the gun region to create a magnetic field within the gun region 420. Other configurations of the magnet 418, suitable for applying a magnetic field within the gun region 420, could also be used and would fall within the scope and spirit of the present invention.

Figure 5:
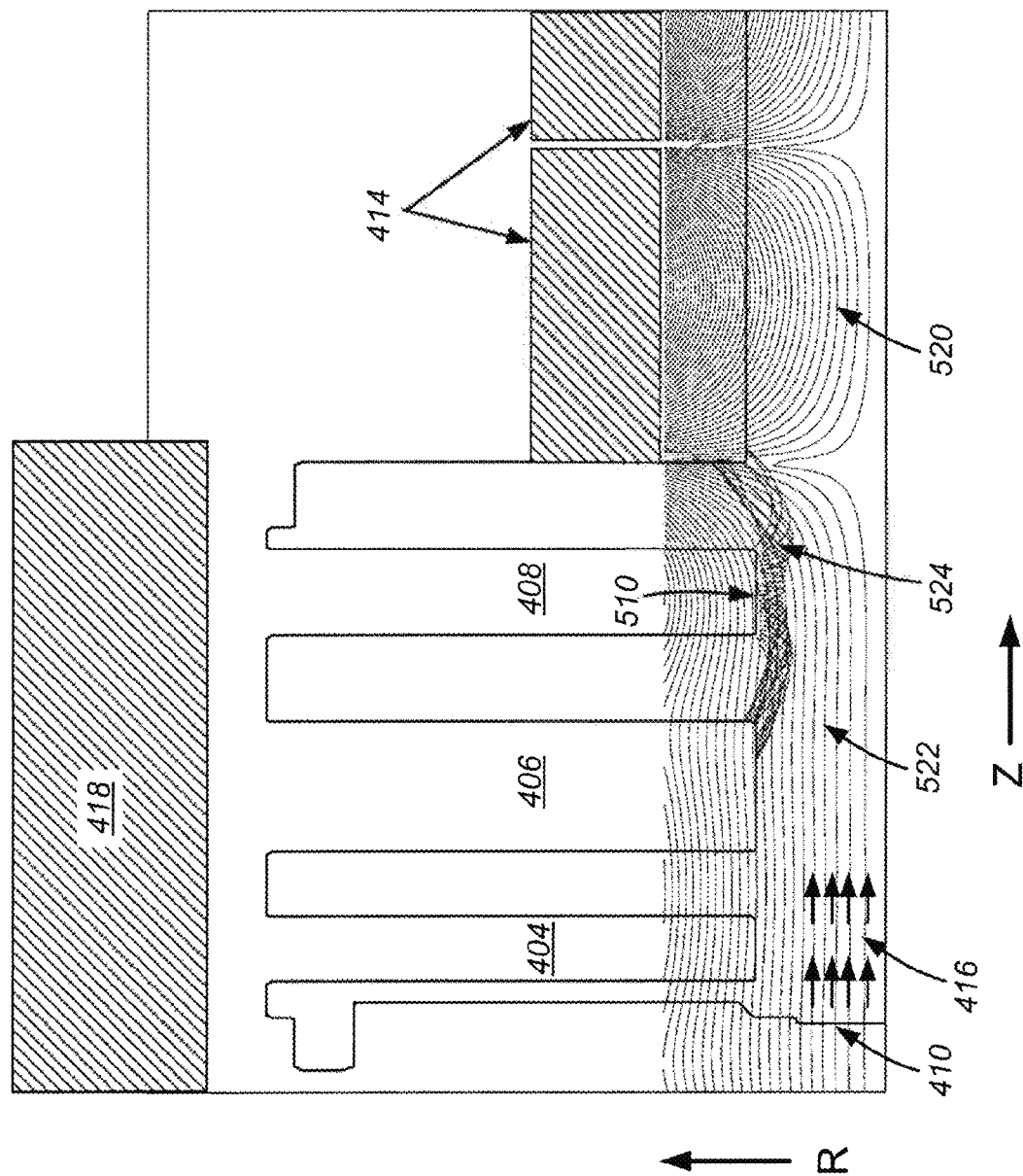
FIG. 5 is a cross section of magnetically insulated cold-cathode electron gun employing a permanent magnet to create an insulating field according to the preferred embodiment of the present invention, illustrating simulated trajectories of secondary electrons emitted from a focusing lens element.

FIG. 5 is an R-Z plot of a cold-cathode electron gun in accordance with the preferred embodiment. Permanent magnet 418 creates a magnetic field in the vicinity of the cold cathode and the electrostatic lenses and is indicated by flux lines 522. Electron beam 416 is emitted from cold cathode 410 into the gun region, where it is focused by electrostatic lens elements 404, 406, and 408. However, when secondary electrons are emitted from surface 510 of a lens element, they interact with the magnetic field indicated by flux lines 522, and their trajectories 524 are strongly deflected to minimize the gun volume affected by the emitted electrons. The slow electron trajectories 524 are now confined to large radial distances far from the main beam path. They do not extend into the beam path or to elements far upstream of the emission point.

Figure 6:
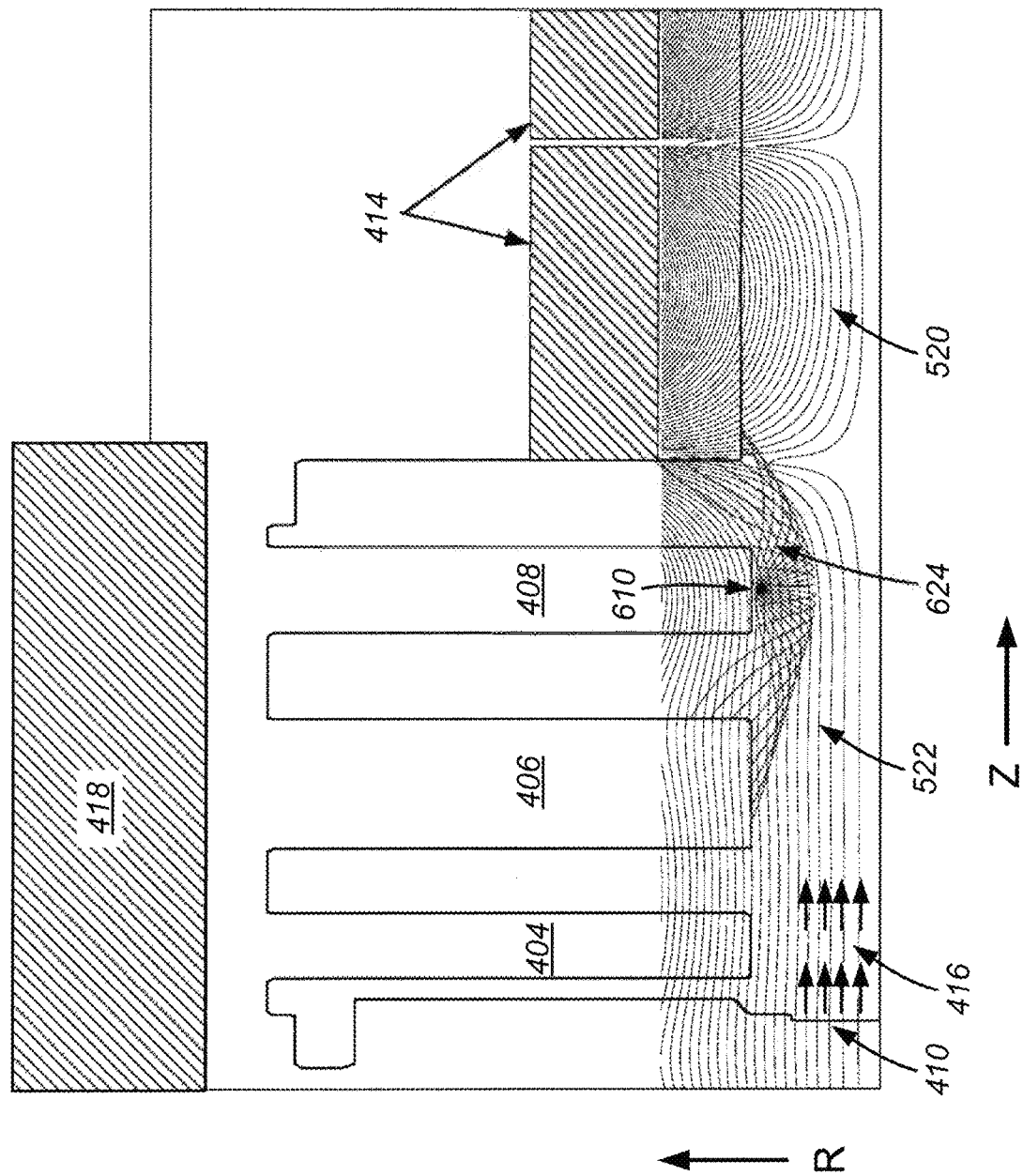
FIG. 6 is a cross section of the cold-cathode electron gun of FIG. 5, showing its increased immunity to the effects of primary re-reflected electrons.

FIG. 6 is an R-Z plot of the same cold-cathode electron gun of FIG. 5 in accordance with the preferred embodiment. Here, the effect of re-reflected primary electrons is illustrated. The re-reflected electrons are shown as being emitted from a single point 610 with the characteristics described previously with respect to FIG. 3. However, with the magnetic insulation provided by magnet 418 in place, the electron trajectories 624 are much more confined. They are limited to radial regions far from the beam axis, and their extent in the Z direction is also constrained. Most importantly, it is seen that the electrons that would strike the cathode in the absence of magnetic insulation are now kept far from the cathode surface. The shape of the magnetic flux lines 522, as indicated in FIGS. 5 and 6, is important because they are preferably oriented such that an electron originating from any of the high-voltage elements, such as lenses 404, 406, and 408, must cross many magnetic flux lines to reach the cathode surface. In other words, the magnetic field should be oriented in a direction that is not substantially parallel to a line of sight from the cold cathode to a re-reflected primary or secondary electron emission site. In one embodiment, this may be achieved by orienting the magnetic field to be substantially parallel to the electron beam axis, as shown in FIGS. 5 and 6. However, aligning the field along the electron beam path is not required, and other configurations requiring re-reflected primary and secondary electrons to cross multiple flux lines to reach the cathode are similarly effective in providing insulation, and such configurations of the magnetic field would fall within the scope and spirit of the present invention.

Figure 7:
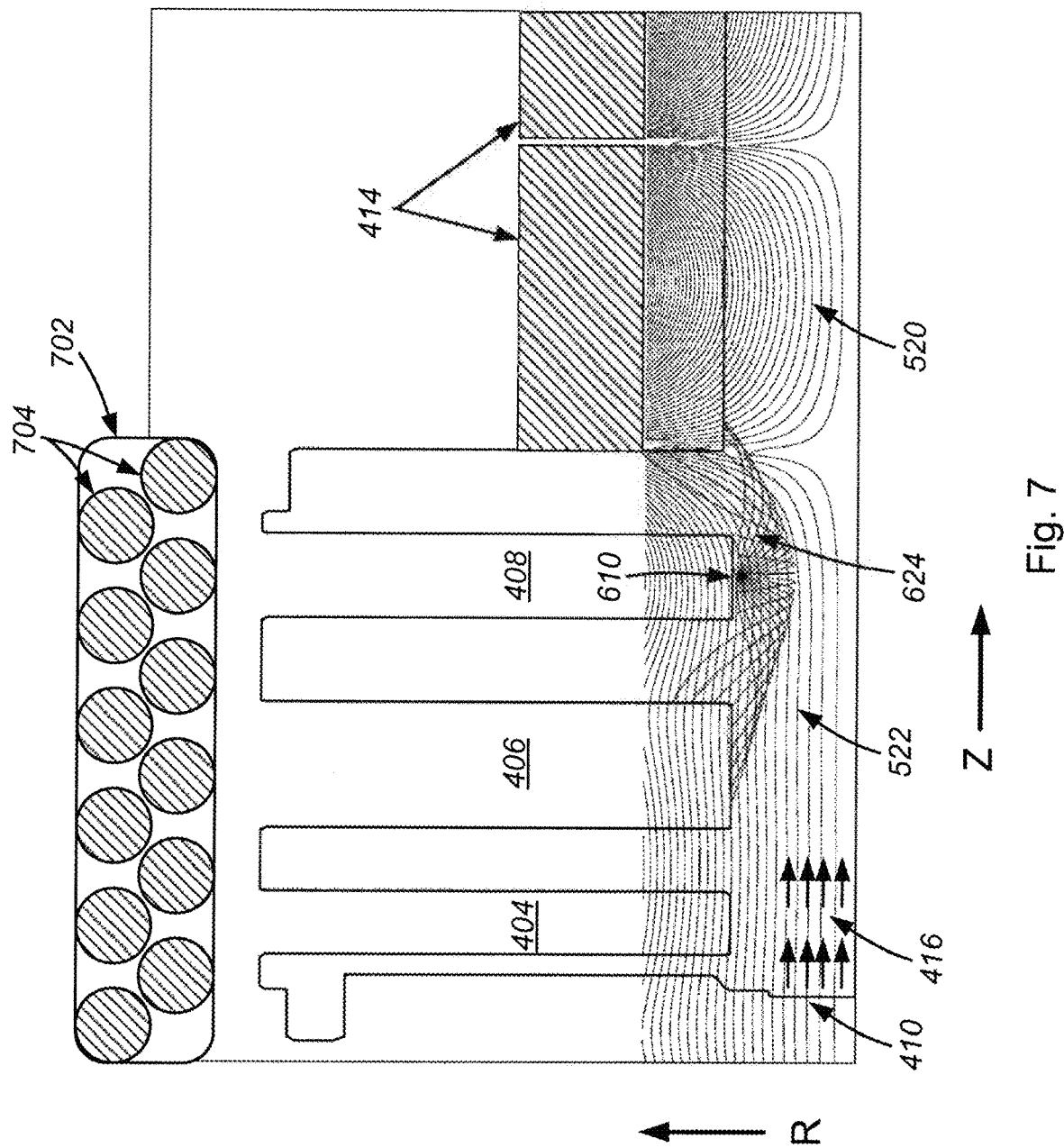
FIG. 7 illustrates an alternative embodiment of a cold-cathode electron gun in accordance with the present invention that employs an electromagnet to create an insulating field.

In an alternative embodiment in accordance with the present invention, the magnetic field in the gun region can be generated by an electromagnet rather than a permanent magnet. FIG. 7 illustrates this structure schematically in an R-Z plot. Electromagnetic assembly 702 is comprised of electrical windings, shown schematically as element 704, situated around the gun region. When electric current is applied to the windings 704, a magnetic field indicated by flux lines 522 is created in the gun region. It should be noted that in either embodiment, while some magnetic leakage fields created by the transport-region magnets 414 may extend into the gun region, they are not of sufficient magnitude to provide adequate magnetic insulation. It should also be noted that the invention applies equally well to cold-cathode electron guns that employ an ion shielding potential profile in the acceleration region and those that do not.

Figure 8:
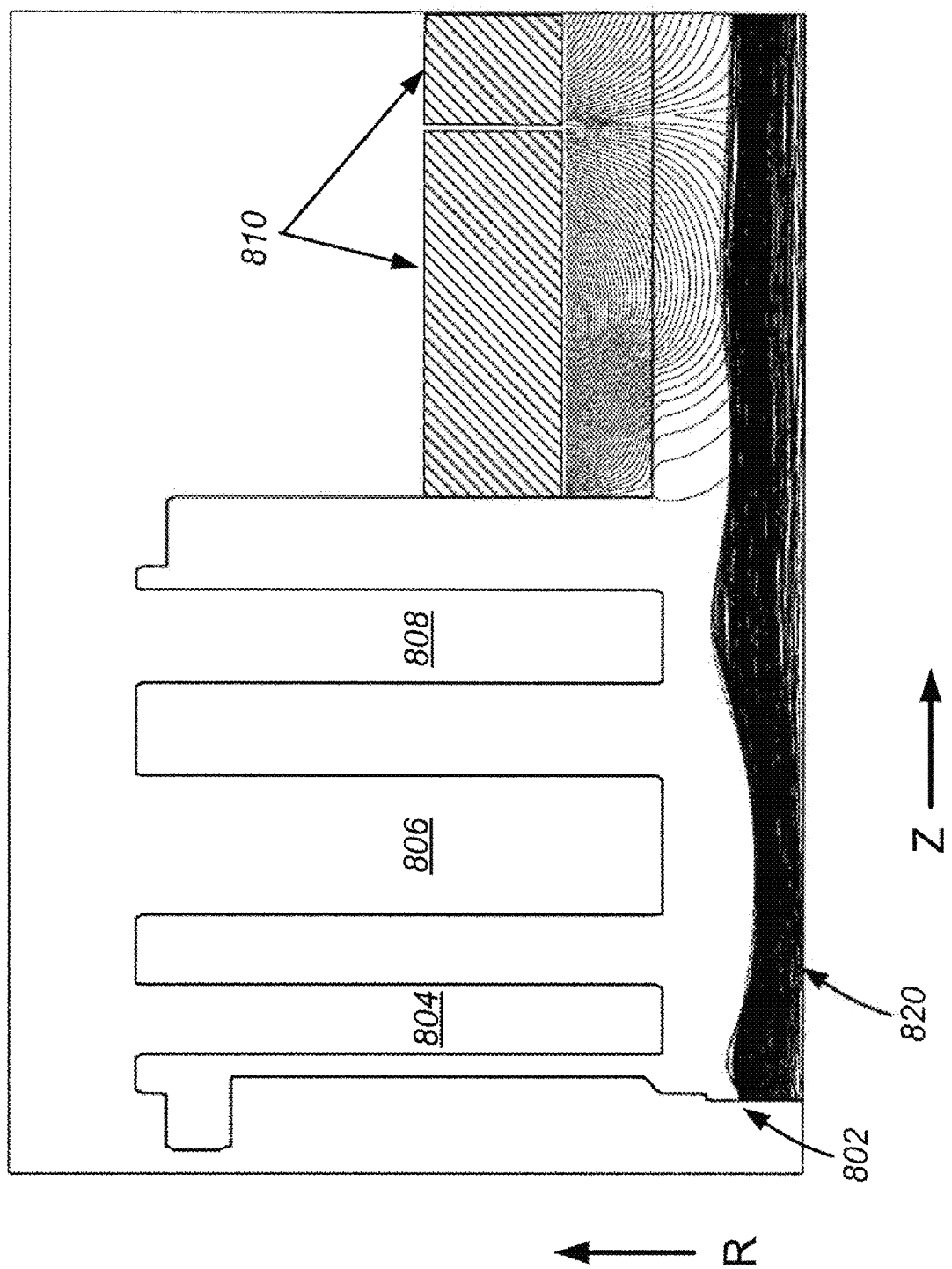
FIG. 8 depicts the beam focusing performance of an electron gun that does not employ magnetic insulation.
Figure 9:
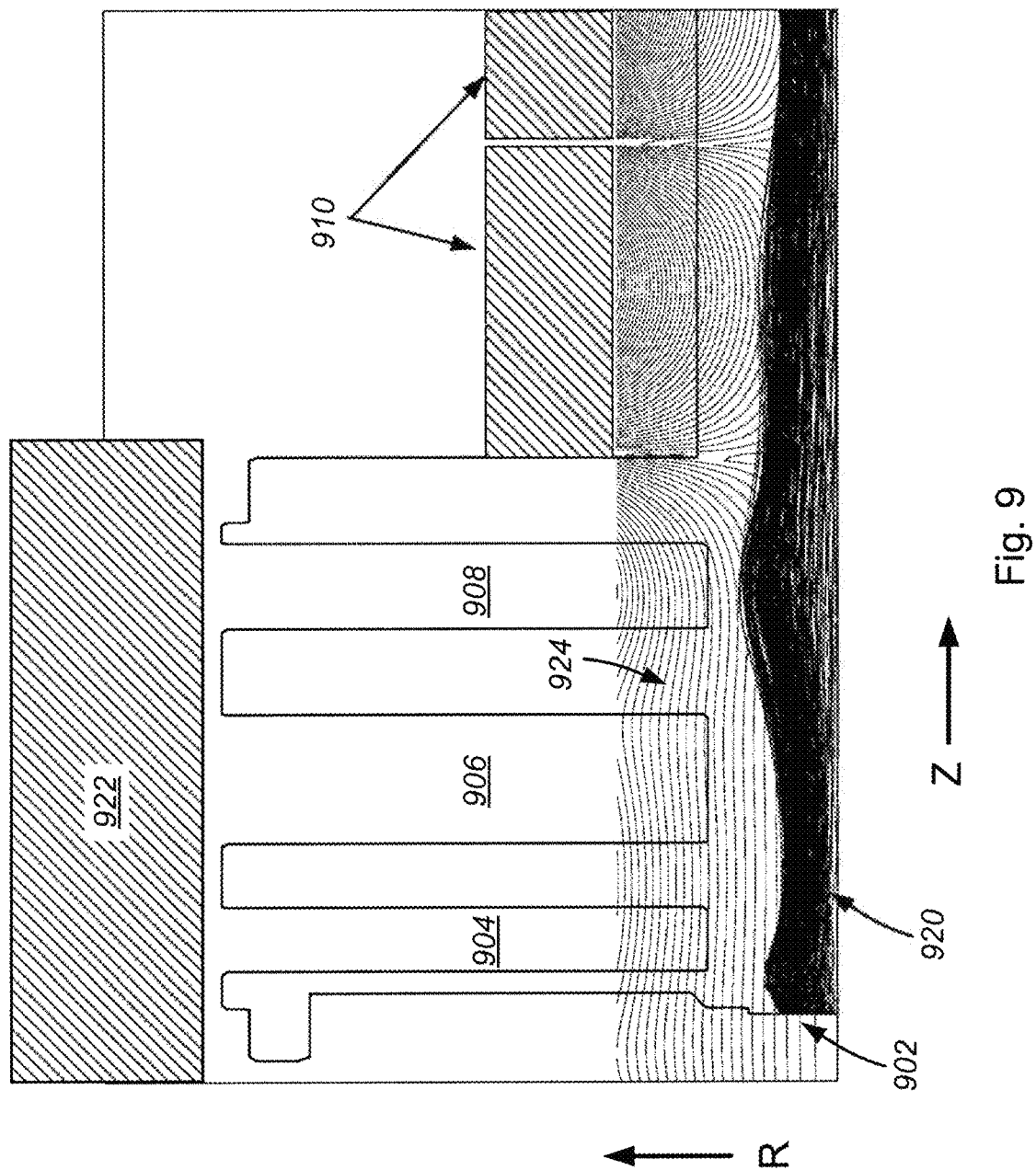
FIG. 9 depicts the beam focusing performance of an electron gun employing magnetic insulation in accordance with the present invention, illustrating that similar beam performance can be achieved with substantially lower focusing voltages.

FIGS. 8 and 9 depict a simulated electron beam profile within a cold-cathode electron gun without and with the magnetic insulation of the present invention, respectively. In FIG. 8, electron beam 820 is emitted from cold cathode 802 into a gun region that does not include an insulating magnetic field. The electron beam in this simulation has a beam current of 0.100 A and the cathode voltage is 3500 V. Electrostatic lenses 804, 806, and 808 are set at high voltage potentials to focus and confine the electron beam 820 to the region near the central axis.

FIG. 9 shows a beam profile within a cold-cathode electron gun that includes magnetic insulation in accordance with an embodiment of the present invention. Electron beam 920 is emitted from cold cathode 902 into a gun region that now contains a substantial magnetic field indicated by flux lines 924 provided by a permanent magnet 922 in accordance with an embodiment of the present invention. It can be seen that the system of FIG. 9 produces an electron beam with confinement characteristics very similar to that produced by the system of FIG. 8. However, only the system of FIG. 9 provides significant insulation of the cold cathode from secondary and primary re-reflected electrons. In addition, the magnetic field indicated by flux lines 924 in the gun region has the added benefit of allowing much lower voltages to be applied to the lens elements 904, 906, and 908. Indeed, the voltages applied in the simulation shown in FIG. 9 are between 24 and 67 percent below those applied in FIG. 8 and yet achieve similar focusing and confinement. This greatly reduces the arc-inducing electric fields within the gun region, further protecting the cathode from destructive arcing events.

In conclusion, the invention provides a novel apparatus and method of magnetically insulating a cold cathode of an electron gun to reduce its susceptibility to damage from an electric arcing event and to reduce leakage currents and parasitic heating within the electron gun. Those skilled in the art will likely recognize further advantages of the present invention, and it should be appreciated that various modifications, adaptations, and alternative embodiments thereof may be made within the scope and spirit of the present invention. The invention is further defined by the following claims.

What is claimed is:

1. An electron gun comprising:
   a cold cathode adapted to emit an electron beam;
   a plurality of electrostatic lenses located in front of the cold cathode and along a path of the electron beam, wherein the plurality of electrostatic lenses is configured to produce a focusing electric field in the vicinity of the electron beam; and
   at least one magnetic apparatus situated in proximity to the cold cathode and the plurality of electrostatic lenses and configured to produce a magnetic field in the vicinity of the electron beam, wherein the magnetic field is configured to substantially insulate the cold cathode from secondary electrons and primary re-reflected electrons emitted from surfaces within the electron gun.

2. The electron gun of claim 1, wherein the at least one magnetic apparatus is further configured to generate the magnetic field such that a direction from the cold cathode to a site of an emitted re-reflected primary or secondary electron is not substantially parallel to a direction of the magnetic field.

3. The electron gun of claim 2, wherein the at least one magnetic apparatus is further configured to generate the magnetic field such that it extends in a direction substantially parallel to the electron beam.

4. The electron gun of claim 1, wherein the at least one magnetic apparatus comprises at least one permanent magnet.

5. The electron gun of claim 4, wherein the at least one permanent magnet comprises a permanent magnet configured to substantially enclose the cold cathode and the plurality of electrostatic lenses.

6. The electron gun of claim 5, wherein the permanent magnet configured to substantially enclose the cold cathode and the plurality of electrostatic lenses is an annular permanent magnet.

7. The electron gun of claim 4, wherein the at least one permanent magnet comprises a plurality of permanent magnets arranged in proximity to one another and substantially surrounding the cold cathode and the plurality of electrostatic lenses.

8. The electron gun of claim 1, wherein the least one magnetic apparatus comprises an electromagnet.

9. The electron gun of claim 1, further including a transport region situated along the path of the electron beam and downstream from the plurality of electrostatic lenses, wherein the transport region includes a drift tube for receiving the electron beam.

10. The electron gun of claim 9, wherein the transport region further includes a transport-region magnetic apparatus situated in proximity to the drift tube and configured to produce a transport-region magnetic field within the drift tube for controlling the electron beam.

11. In an electron gun including an electron beam emitted from a cold cathode, a method of insulating the cold cathode from destructive arcing events comprises the steps of:
providing a plurality of electrostatic lenses in front of the cold cathode along a path of the electron beam;
applying voltage potentials to the plurality of electrostatic lenses;
providing a magnetic apparatus around the electron gun to generate a magnetic field extending through a region including the cold cathode, the plurality of electrostatic lenses and the path of the electron beam, wherein the magnetic field acts to substantially insulate the cold cathode from electrons emitted from surfaces of the electrostatic lenses.

12. The method of claim 11, wherein the step of providing a magnetic apparatus further comprises arranging the magnetic apparatus such that the magnetic field is not substantially parallel to a direction from the cold cathode to a site of a re-reflected primary or secondary electron emitted from a surface of the electrostatic lenses.

13. The method of claim 12, wherein the step of arranging the magnetic apparatus further comprises arranging the magnetic apparatus such that the magnetic field is substantially parallel to a path of the electron beam.

14. The method of claim 11, wherein the step of providing a magnetic apparatus further comprises locating at least one permanent magnet around the electron gun.

15. The method of claim 11, wherein the step of providing a magnetic apparatus further comprises locating at least one electromagnet around the electron gun.

16. An electron gun comprising:
a cold cathode adapted to emit an electron beam;
a plurality of electrostatic lenses located in front of the cold cathode and along a path of the electron beam, wherein the plurality of electrostatic lenses is configured to produce a focusing electric field in the vicinity of the electron beam; and
at least one magnetic apparatus situated in proximity to the cold cathode and the plurality of electrostatic lenses and configured to provide a magnetic field in the vicinity of the electron beam, wherein the magnetic field is oriented in a direction that is not substantially parallel to a direction from the cold cathode to an electron emission site on a surface of one of the plurality of electrostatic lenses, such that the cold cathode is substantially insulated from secondary electrons and primary re-reflected electrons emitted from the electron emission site.

17. The electron gun of claim 16, wherein the at least one magnetic apparatus is further adapted such that the magnetic field is substantially parallel to a path of the electron beam.

18. The electron gun of claim 16, wherein the at least one magnetic apparatus comprises at least one permanent magnet.

19. The electron gun of claim 18, wherein the at least one permanent magnet comprises an annular magnet.

20. The electron gun of claim 16, wherein the gun-region magnetic apparatus comprises at least one electromagnet.

21. The electron gun of claim 16, further including a transport region situated along the path of the electron beam and downstream from the plurality of electrostatic lenses, wherein the transport region includes a drift tube for receiving the electron beam.

22. The electron gun of claim 21, wherein the transport region further includes a transport-region magnetic apparatus situated in proximity to the drift tube and configured to produce a transport-region magnetic field within the drift tube for controlling the electron beam.

* * * * *